US008753953B1

(12) United States Patent
Cheng et al.

(10) Patent No.: US 8,753,953 B1
(45) Date of Patent: Jun. 17, 2014

(54) SELF ALIGNED CAPACITOR FABRICATION

(71) Applicant: International Business Machines Corporation, Armonk, NY (US)

(72) Inventors: Kangguo Cheng, Schenectady, NY (US); Bruce B. Doris, Brewster, NY (US); Pouya Hashemi, White Plains, NY (US); Ali Khakifirooz, Mountain View, CA (US); Alexander Reznicek, Troy, NY (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 13/837,810

(22) Filed: Mar. 15, 2013

(51) Int. Cl.
H01L 21/20 (2006.01)

(52) U.S. Cl.
USPC ........... 438/396; 438/269; 438/399; 438/481; 438/724; 257/640; 257/760

(58) Field of Classification Search
CPC . H01L 21/2018; H01L 21/2022; H01L 21/84; H01L 27/1203; H01L 27/0647; H01L 27/0652; H01L 27/10; H01L 27/101; H01L 21/02422; H01L 21/02532; H01L 21/02592; H01L 21/02595; H01L 21/02636; H01L 21/02645; H01L 21/76289; H01L 21/02647
USPC ................ 438/724, 744, 269, 341, 399, 481; 257/640, 760, E21.131, E21.133, 257/E21.562, E21.566
See application file for complete search history.

(56) References Cited

U.S. PATENT DOCUMENTS

| | | | |
|---|---|---|---|
| 4,942,137 A | 7/1990 | Sivan et al. | 438/246 |
| 4,948,456 A * | 8/1990 | Schubert | 117/90 |
| 5,070,034 A | 12/1991 | Satoh et al. | 438/238 |
| 5,728,617 A | 3/1998 | Tseng | 438/253 |
| 5,792,687 A | 8/1998 | Jeng et al. | 438/253 |
| 5,907,774 A | 5/1999 | Wise | 438/254 |
| 6,037,234 A | 3/2000 | Hong et al. | 438/396 |
| 6,287,699 B1 * | 9/2001 | Yasuda et al. | 428/446 |
| 6,335,237 B1 | 1/2002 | Tang et al. | 438/238 |
| 6,905,944 B2 | 6/2005 | Chudzik et al. | 438/435 |
| 7,101,762 B2 * | 9/2006 | Cohen et al. | 438/283 |
| 8,395,217 B1 * | 3/2013 | Cheng et al. | 257/350 |
| 2002/0130353 A1 * | 9/2002 | Lieber et al. | 257/315 |
| 2007/0015346 A1 * | 1/2007 | Cohen et al. | 438/481 |
| 2007/0121364 A1 * | 5/2007 | Bertin et al. | 365/129 |
| 2008/0169488 A1 * | 7/2008 | Segal et al. | 257/209 |
| 2010/0112762 A1 * | 5/2010 | Adam et al. | 438/149 |
| 2011/0212603 A1 * | 9/2011 | Arena et al. | 438/478 |
| 2012/0119218 A1 * | 5/2012 | Su | 257/76 |
| 2013/0115721 A1 * | 5/2013 | Clark | 438/12 |
| 2013/0270655 A1 * | 10/2013 | Adam et al. | 257/410 |

OTHER PUBLICATIONS

G. Rubloff, "Maskless selected area processing," Journal of Vacuum Science & Technology B, vol. 7, Issue 6, Nov. 1989, pp. 1454-1461.
S. Yokoyama et al., "Low-temperature selective deposition of silicon on silicon nitride by time-modulated disilane flow and formation of silicon narrow wires," Applied Physics Letters, vol. 79, Issue 4, 2001, 494, 3 pages.

* cited by examiner

Primary Examiner — Jarrett Stark
Assistant Examiner — Bitew Dinke
(74) Attorney, Agent, or Firm — Ido Tuchman; Vazken Alexanian

(57) ABSTRACT

A capacitor and method for fabricating the same. In one configuration, the capacitor has a silicon substrate, a first and a second silicon dioxide layer over the silicon substrate, and silicon nitride fins between the silicon dioxide layers. The capacitor further includes a dielectric layer over the silicon nitride fins and metal vias in the dielectric layer.

14 Claims, 10 Drawing Sheets

SELF ALIGNED CAPACITOR FABRICATION

BACKGROUND

The present invention relates to integrated circuits. More particularly, the present invention relates to a capacitor formed in a vertical manner.

Deep trench capacitors are known to require the deposition and planarization of doped polysilicon using techniques such as chemical mechanical planarization ("CMP") to achieve a flat surface over a silicon layer after its deposition. However, utilizing CMP is not ideal because it involves multi-stage processes and is relatively expensive. Other capacitors are also known to have many mask levels and a complex process flow.

SUMMARY

Accordingly, one example aspect of the present invention is a capacitor. The capacitor includes a silicon substrate and a silicon dioxide layer over the silicon substrate. There is a silicon nitride fin over the silicon dioxide layer. The silicon nitride fin may also have a dielectric layer over the fin.

Another example of the present invention is a method for fabricating a capacitor. The method includes receiving a silicon substrate with a silicon dioxide layer over the silicon substrate. A depositing step deposits a silicon nitride layer over the silicon dioxide layer. A patterning step patterns the silicon nitride layer to form a plurality of silicon nitride fins. Silicon film is grown selectively from the silicon nitride fins. A depositing step deposits a dielectric over the silicon nitride layer.

BRIEF DESCRIPTION OF DRAWINGS

The subject matter which is regarded as the invention is particularly pointed out and distinctly claimed in the claims at the conclusion of the specification. The foregoing and other objects, features, and advantages of the invention are apparent from the following detailed description taken in conjunction with the accompanying drawings in which:

DETAILED DESCRIPTION

Figure 1:
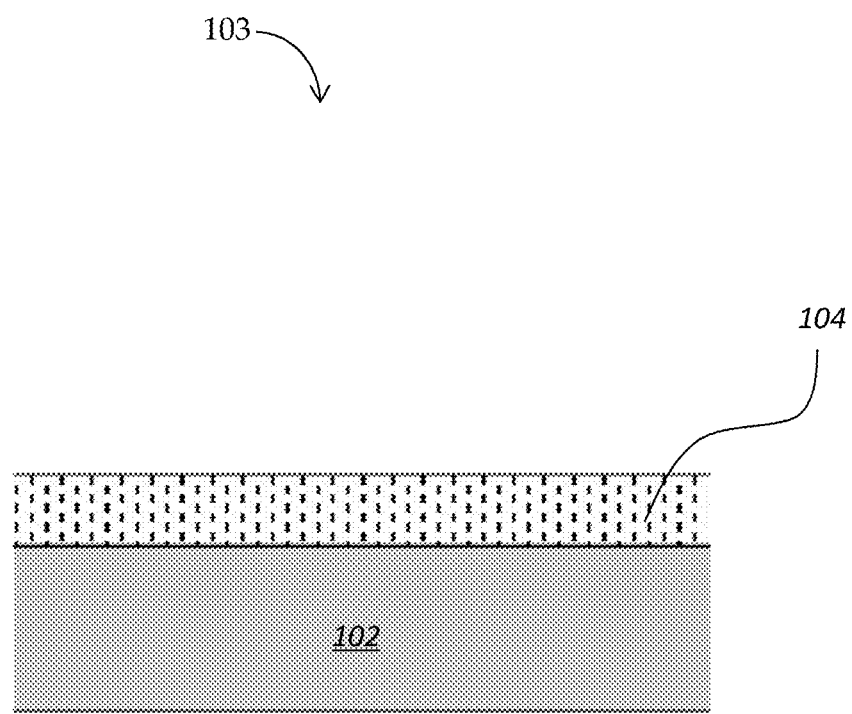
FIG. 1 shows a capacitor fabrication step according to one embodiment of the present invention.

The present invention is described with reference to embodiments of the invention, but shall not be limited to the referenced embodiments. Throughout the description of the present invention, references are made to FIGS. 1 through 9.

When referring to the figures, like structures and elements shown throughout are indicated with like reference numerals.

FIG. 1 shows a capacitor fabrication step according to one embodiment of the present invention. As shown, a starting material 103 includes a first silicon dioxide layer 104 over a silicon substrate 102. In another embodiment, a first silicon dioxide layer 104 may be formed using thermal oxidation or chemical vapor deposition.

Figure 2:
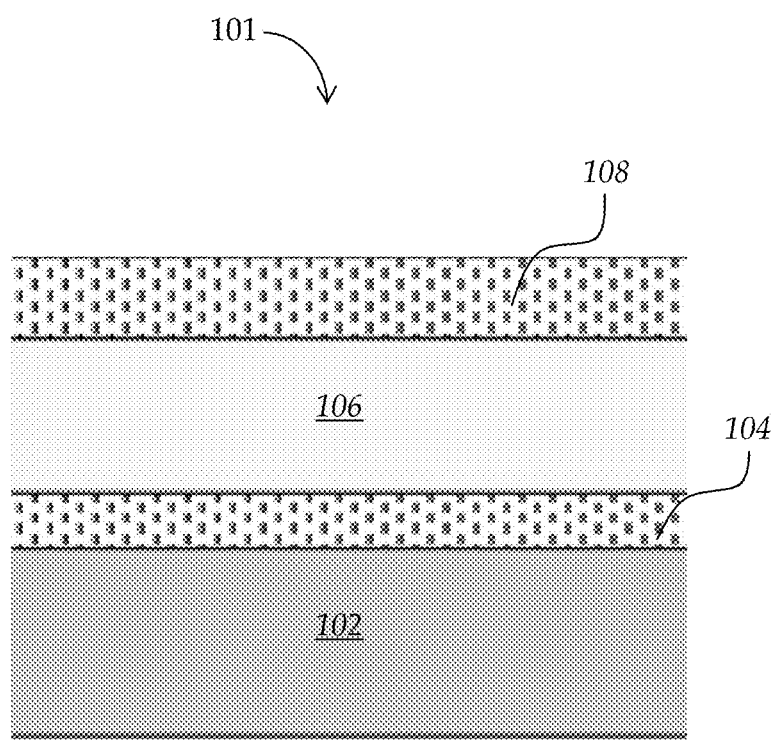
FIG. 2 shows a capacitor fabrication step according to embodiment of the present invention.

FIG. 2 shows a further capacitor fabrication step according to one embodiment of the present invention. As shown, a silicon nitride layer 106 is deposited over the first silicon dioxide layer 104. Next, a second silicon dioxide layer 108 may be deposited over the silicon nitride layer 106. In one embodiment, the silicon nitride layer 106 is in physical contact with the second silicon dioxide layer 108. In another embodiment, the second silicon dioxide layer 108 may be excluded.

Figure 3:
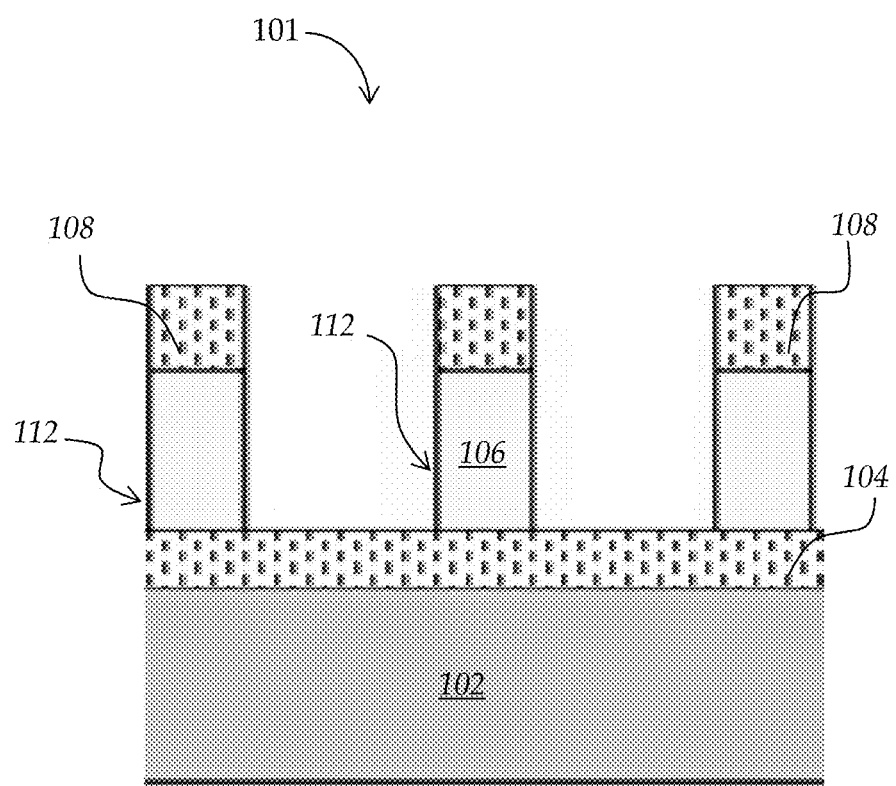
FIG. 3 shows a capacitor fabrication step according to one embodiment of the present invention.

FIG. 3 shows a further capacitor fabrication step according to another embodiment of the present invention. In this embodiment, silicon nitride fins 112 are formed over the first silicon dioxide layer 104. The second silicon dioxide layer 108 and the silicon nitride layer 106 may be patterned to form any desired shape, such as a square or rectangle. In one embodiment, the second silicon dioxide layer 108 and the silicon nitride layer 106 are patterned to form multiple silicon nitride fins 112 with opposing walls.

The silicon nitride fins 112 may be formed by a dry etch selective to both the second silicon dioxide layer 108 and the silicon nitride layer 106. The silicon nitride layer 106 and the second silicon dioxide layer 108 are patterned using standard photolithography and dry etch, stopping on the first silicon dioxide layer 104. The dry etch may be composed of two steps. The first step is a dry etch step that is capable of etching silicon dioxide selective to silicon, and the second dry etch process is capable of etching silicon nitride selective to silicon dioxide. The result may be a pillar-like dual film pattern feature located over the first silicon dioxide layer 102.

In another embodiment, the second silicon dioxide layer 108 may be excluded. Instead, silicon nitride fins 112 can be formed using a dry etch process capable of etching silicon nitride selective to silicon oxide, etching the silicon nitride layer 106 alone.

Figure 4:
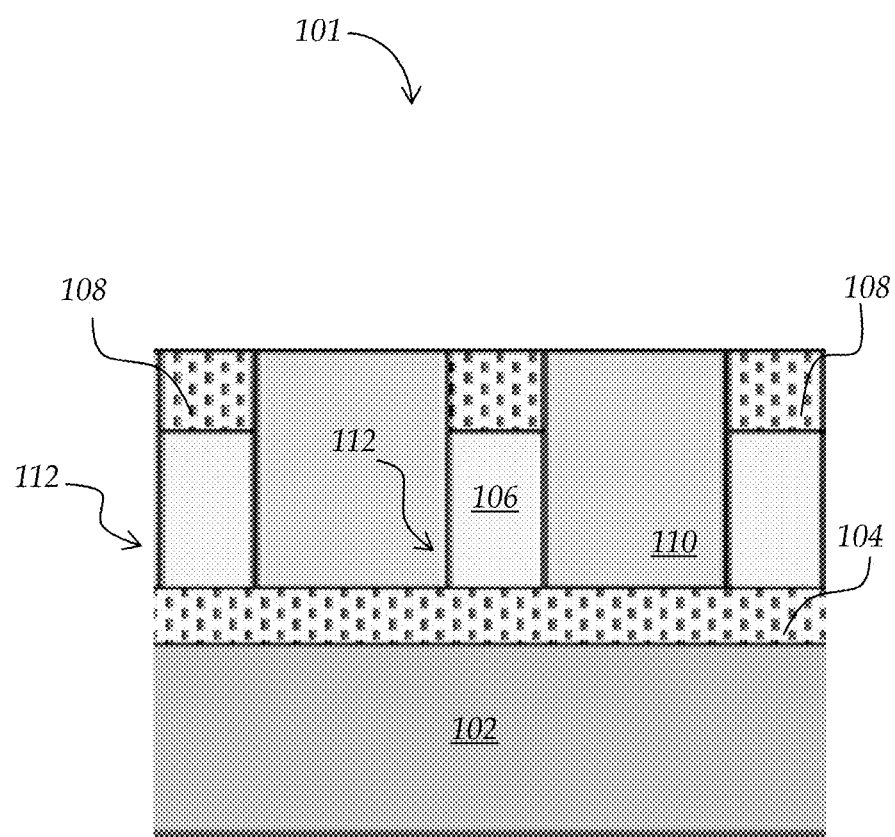
FIG. 4 shows a capacitor fabrication step according to one embodiment of the present invention.

FIG. 4 shows a further capacitor fabrication step according to another embodiment of the present invention. As shown, a silicon film 110 is gown on opposing walls of the silicon nitride fins 112. The silicon film 110 may be grown via epitaxial growth using a process capable of depositing silicon on silicon nitride in a selective manner with respect to silicon oxide. In one embodiment, the silicon film 110 is epitaxially grown as disclosed in U.S. Pat. No. 7,687,804 issued Mar. 30, 2010, the entire content of which is incorporated by reference herein.

Growing silicon from the silicon nitride fins 112 causes the silicon to grow from each opposing wall of adjacent fins until the silicon film 110 fills the space between the walls. The resulting silicon film 110 may be deposited exclusively on opposing walls of the silicon nitride fins 112, grow upward above the silicon nitride fins 112, or selectively grown to cease at any time depending on the amount of growth desired. The second silicon dioxide layer 108 can be used as an oxide cap or it can be excluded and the silicon film 110 can be polished.

Using the second silicon dioxide layer 108 as an oxide cap over the silicon nitride layer 106 during the selective growth process helps ensure that the silicon film 110 does not grow from the top of the nitride layer 106 in a spherical manner. The second silicon dioxide layer 108 is placed over the silicon nitride layer 106 to create isolation between the metallic-like SiN of the opposing walls of adjacent silicon nitride fins 112, which are on the left and the right of the silicon film 110. As long as the growth is stopped at reasonable time, the silicon film 110 should not grow above the height of the silicon nitride fins 112 because of the isolation. The silicon nitride fins 112 can then be filled with material. This process may be beneficial because it is a simple and inexpensive process that does not require polishing the silicon film 110.

In another embodiment, the second silicon dioxide layer 108 may be excluded. Excluding the second dioxide layer 108 enables the silicon film 110 to grow over of the silicon nitride layer 106 and above the height of the silicon nitride fins 112. In this process, the silicon film 110 may be polished back using chemical mechanical planarization ("CMP").

The silicon film 110 can be in-situ doped with phosphorus, arsenic, or boron. In addition, it may be implanted with any dopant species, which causes the silicon film 110 to be conductive.

Figure 5:
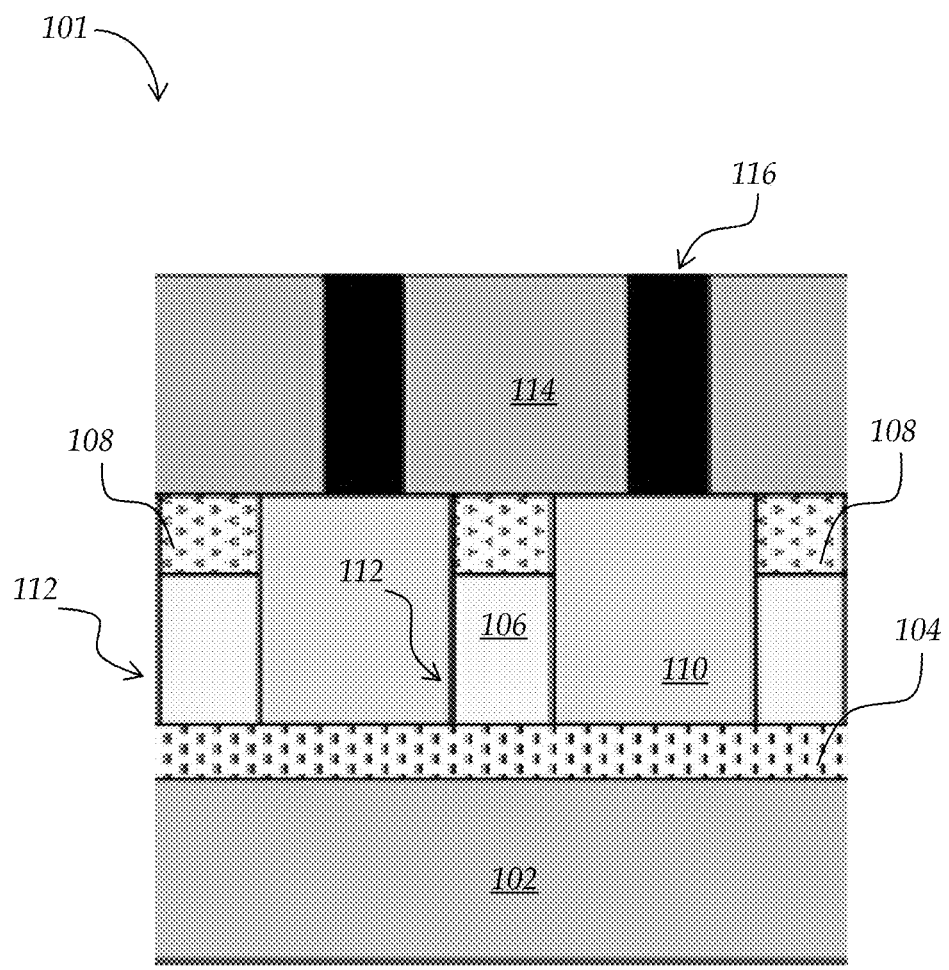
FIG. 5 shows a capacitor fabrication step according to one embodiment of the present invention.

FIG. 5 shows a capacitor 101 according to one embodiment of the present invention. As shown, the capacitor 101 includes a dielectric layer 114 over the silicon nitride fin 112. After the dielectric layer 114 is deposited, it may be etched and metal vias 116 may be deposited in the etched spaces of the dielectric layer 114. Standard lithography and reactive ion etching ("RIE") process may be utilized to form the metal via 116 contacts to the silicon film 110. Standard M1 processing may be used to wire the contracts.

Figure 6:
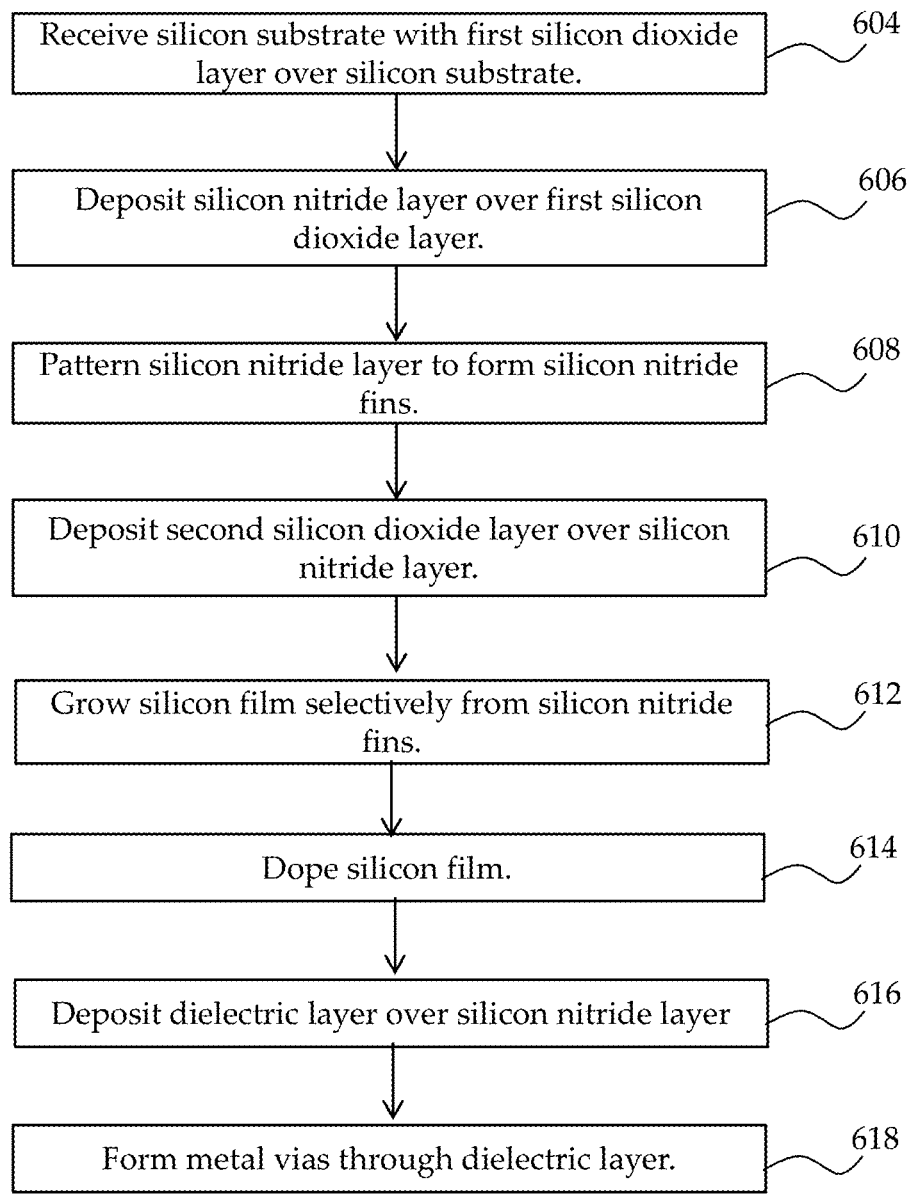
FIG. 6 shows a method for fabricating a capacitor in accordance with one embodiment of the present invention.

FIG. 6 shows a method for fabricating a capacitor in accordance with one embodiment of the present invention. The method includes receiving step 604. During receiving step 604, a silicon substrate with a first silicon dioxide layer over the silicon substrate is received. In one embodiment, the first silicon dioxide layer is formed using thermal oxidation or chemical vapor deposition. After receiving step is complete, the method continues to depositing step 606.

During depositing step 606, a silicon nitride layer is deposited over the first silicon dioxide layer. In one embodiment, the silicon nitride layer may be in direct contact with the first silicon dioxide layer. After depositing step 606 is complete, the method continues to patterning step 608.

During patterning step 608, the silicon nitride layer is patterned to form a plurality of silicon nitride fins. After patterning step 608 is complete, the method continues to depositing step 610.

During depositing step 610, a second silicon dioxide layer is deposited over the silicon nitride layer. In one embodiment, the second silicon dioxide layer is in physical contact with the silicon nitride layer. After depositing step 610 is complete, the method continues to growing step 612.

During growing step 612, a silicon film is selectively grown from the silicon nitride fins. After growing step 612 is complete, the method continues to doping step 614.

During doping step 614, the silicon film is doped. In one embodiment, the silicon film can be implanted with a dopant species such that the silicon film is electrically conductive. The dopant species may be selected from phosphorus, arsenic, and boron. An activation anneal is needed to electrically activate the dopants in the case where the silicon is implanted. In another embodiment, the silicon film may be doped while being grown from the silicon nitride fin. After doping step 614 is complete, the method continues to depositing step 616.

During depositing step 616, a dielectric layer is deposited over the silicon nitride layer. In one embodiment, the dielectric layer may be flowable oxide. In another embodiment, the dielectric layer may be selected from boron silicate Glass (BSG), boron phosphorus silicate glass (BPSG), and phosphorus silicate glass (PSG). After depositing step 616 is complete, the method continues to forming step 618.

During forming step 618, metal vias are formed through the dielectric layer. In this embodiment, the metal vias may be in electrical contact with the silicon film.

Figure 7:
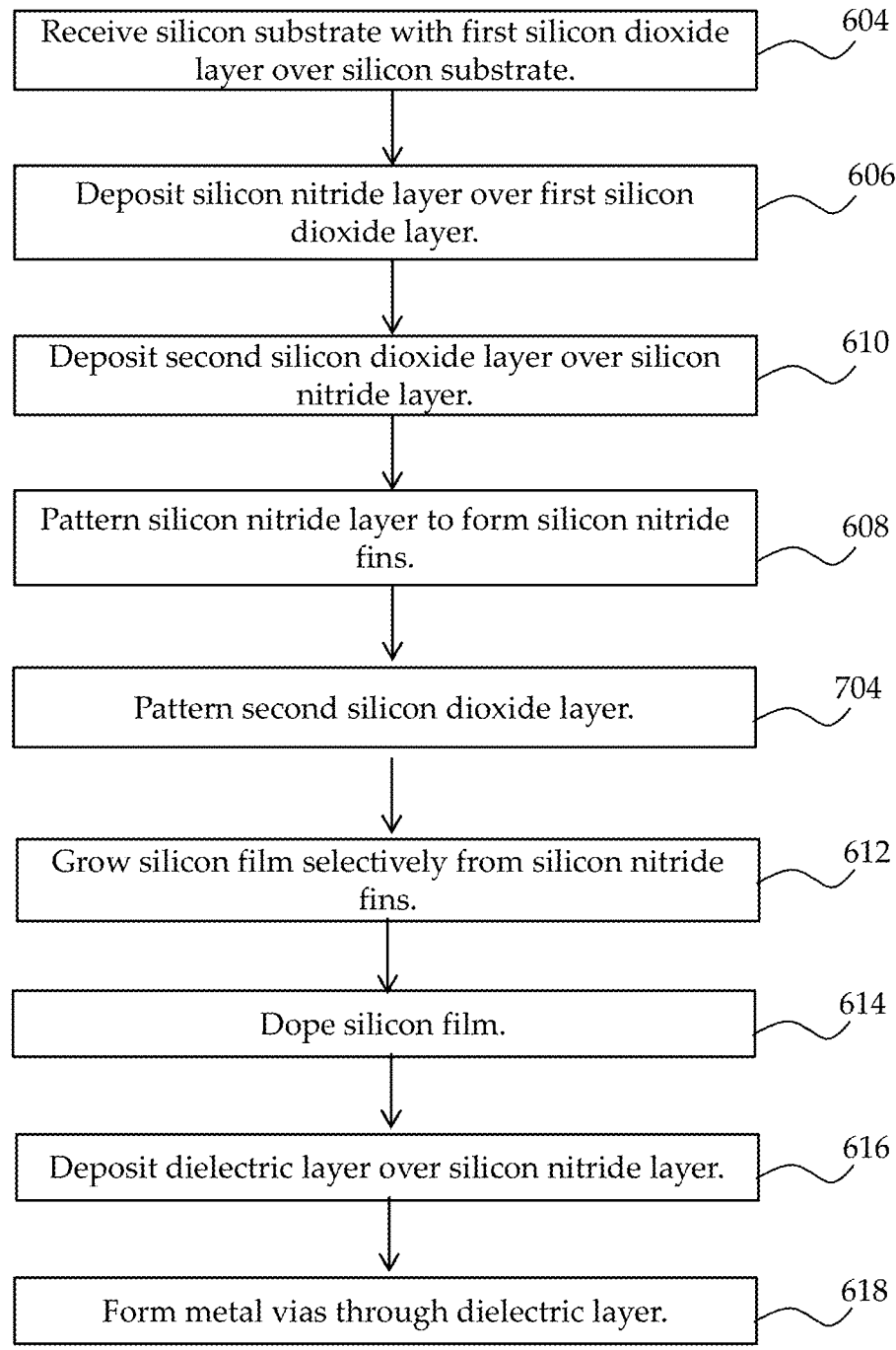
FIG. 7 shows a further method for fabricating a capacitor in accordance with one embodiment of the present invention.

FIG. 7 shows a method for fabricating a capacitor in accordance with another embodiment of the present invention. The method includes receiving step 604 and depositing step 606 described above. After depositing step 606, the method continues to depositing step 610.

At depositing step 610, the second silicon dioxide layer is deposited on the silicon nitride layer. The silicon nitride layer may be in physical contact with the second silicon dioxide layer. After depositing layer 610, patterning steps 704 and 608 are performed.

At patterning steps 704 and 608, the second silicon dioxide layer and the silicon nitride layer are patterned. In one embodiment, the silicon nitride layer is patterned at patterning step 608 before the second silicon layer is patterned at patterning step 704. After pattering steps 704 and 608, the method continues to growing step 612, doping step 614, depositing step 616, and forming step 618 described above.

Figure 8A:
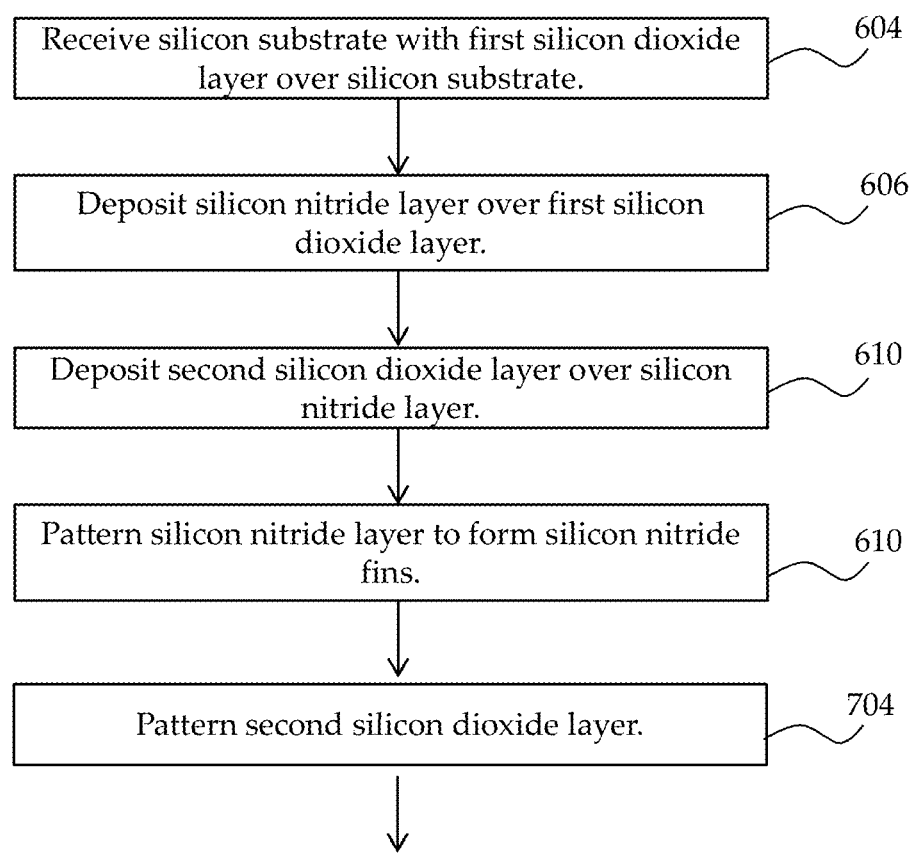
FIGS. 8A and 8B show another method for fabricating a capacitor in accordance with one embodiment of the present invention.
Figure 8B:
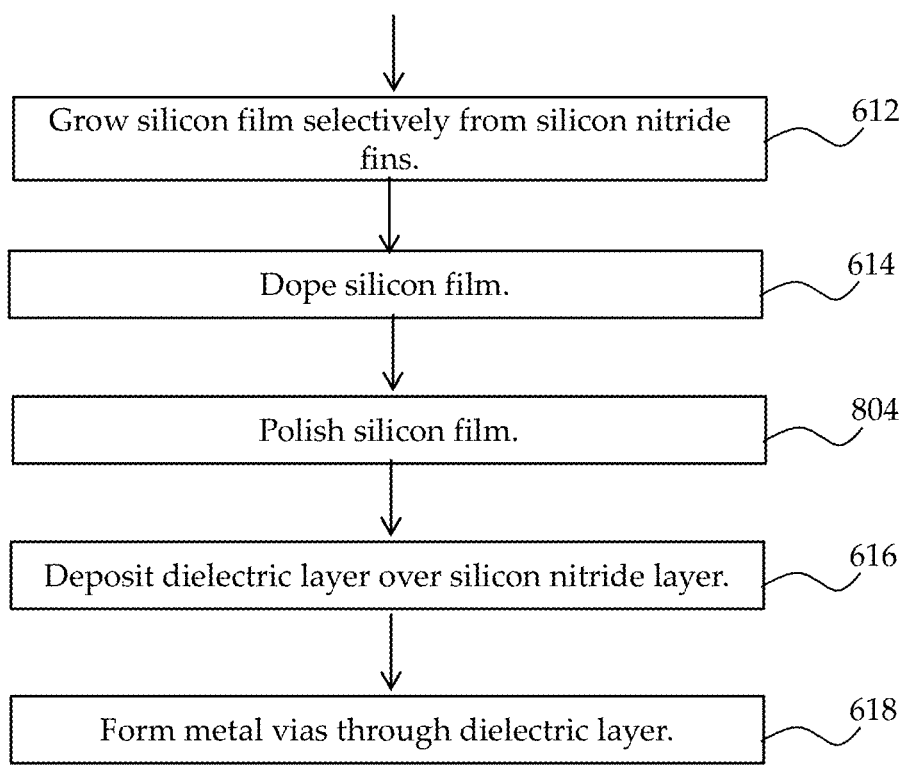

FIGS. 8A and 8B show another method for fabricating a capacitor in accordance with one embodiment of the present invention. The method includes receiving step 604, depositing steps 606 and 610, patterning steps 608 and 704, growing step 612, and doping step 614 described above. After doping step 614, method continues to polishing step 804.

At polishing step 804, the silicon film is polished. After polishing step 804, the method continues to depositing step 616 and forming step 618 described above.

Figure 9:
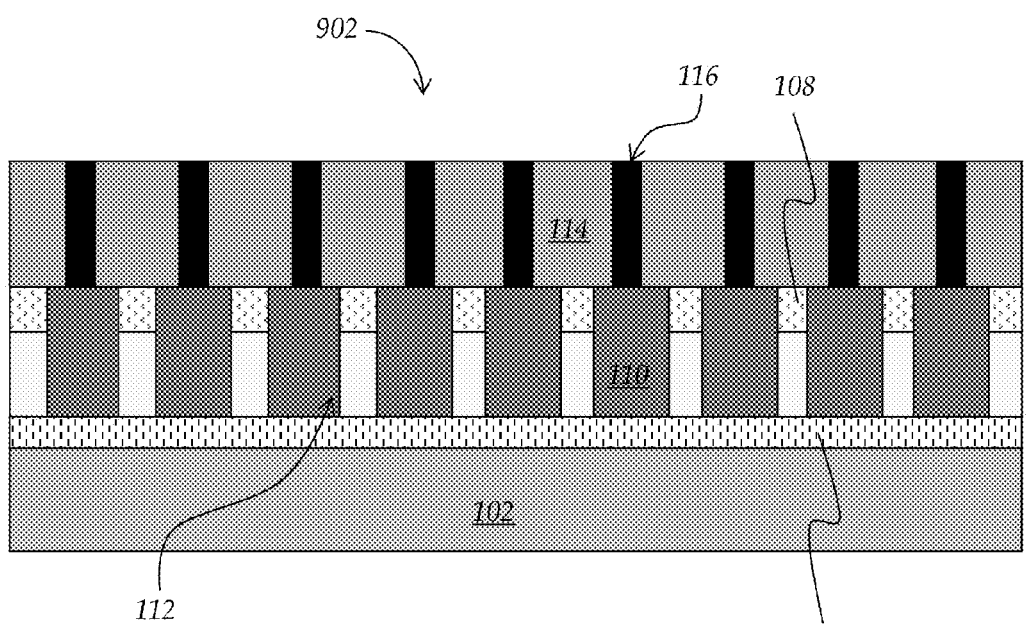
FIG. 9 shows an array of capacitors according to one embodiment of the present invention.

FIG. 9 shows an array of capacitors 902 according to one embodiment of the present invention. As shown, the array of capacitors 902 includes a first silicon dioxide layer 104 over silicon substrate 102. The first silicon dioxide layer 104 may be formed using thermal oxidation or chemical vapor deposition. A silicon nitride layer 106 is deposited over the first silicon dioxide layer 104. A second silicon dioxide layer 108 may be deposited over the silicon nitride layer 106. In one embodiment, the silicon nitride layer 106 is in physical contact with the second silicon dioxide layer 108.

Silicon nitride fins 112 are formed over the first silicon dioxide layer 104. The silicon nitride fins 112 may be formed using a dry etch selective to both the second silicon dioxide layer 108 and the silicon nitride layer 106. The second silicon dioxide layer 108 and the silicon nitride layer 106 may be patterned to form any desired shape, such as a square or rectangle.

The silicon nitride layer 106 and the second silicon dioxide layer 108 are patterned using standard photolithography and dry etch, stopping on the first silicon dioxide layer 104. The dry etch may be composed of two steps. The first step is a dry etch step that is capable of etching SiO2 selective to Si, and the second dry etch process is capable of etching SiN selective to SiO2. The result may be a pillar-like dual film pattern feature, composed of the second silicon dioxide layer 108 and the silicon nitride layer 106, patterned to form multiple silicon nitride fins 112 with opposing walls located over the first silicon dioxide layer 102.

A silicon film 110 is gown on opposing walls of the silicon nitride fins 112. The silicon film 110 may be grown via epitaxial growth using a process capable of depositing Si on SiN in a selective manner with respect to SiO2, as described, for example, in U.S. Pat. No. 7,687,804 issued Mar. 30, 2010. Growing Si from the silicon nitride fins 112 causes the Si to grow from each opposing wall of adjacent fins until the silicon film 110 fills the space between the walls. The resulting silicon film 110 may be deposited exclusively on opposing walls of the silicon nitride fins 112, grown upward above the silicon nitride fins 112, or selectively grown to cease growth at any time depending on the amount of growth desired.

Using the second silicon dioxide layer 108 as an oxide cap over the silicon nitride layer 106 during the selective growth process ensures that the silicon film 110 does not grow from the top of the nitride layer 106 in a spherical manner. The second silicon dioxide layer 108 is placed over the silicon nitride layer 106 to create isolation between the metallic-like SiN of the opposing walls of adjacent silicon nitride fins 112 that are on the left and the right of the silicon film 110. As long as the growth is stopped at reasonable time, the silicon film 110 may not grow above the height of silicon nitride fins 112 because of the isolation. This process may be beneficial because it is a simple inexpensive process that does not require polishing silicon film 110.

In another embodiment, the second silicon dioxide layer 108 may be excluded. Instead, the silicon nitride fins 112 can be formed using a dry etch process capable of etching SiN selective to SiO, etching silicon nitride layer 106 alone. The result may be a pillar-like film pattern feature, composed of the silicon nitride layer 106, patterned to form the multiple silicon nitride fins 112 with opposing walls located over the first silicon dioxide layer 102.

Instead of using the second silicon dioxide layer 108 can be used as an oxide cap, the second silicon dioxide layer can be excluded and the silicon film 110 can be polished. Excluding the second dioxide layer 108 may enable the silicon film 110 to grow over the silicon nitride layer 106 and above the height of the silicon nitride fins 112. CMP may be utilized to polish back the silicon film 110.

In either embodiment, the silicon film 110 may be in-situ doped with phosphorus, arsenic, and boron or can be implanted with any dopant species. The dopant causes the silicon film 110 to be conductive.

The capacitor array 902 also includes a dielectric layer 114 over the silicon nitride fin 112. After the dielectric layer 114 is deposited, it may be etched and metal vias 116 are deposited in the etched spaces of the dielectric layer 114. Standard lithographic and RIE processes may be utilized to form the metal via 116 contacts to the silicon film 110. A standard M1 processing may be used to wire the contracts.

The flowcharts and diagrams in the Figures illustrate the architecture, functionality, and fabrication of possible implementations of a memory array device according to various embodiments of the present invention. It should be noted that, in some alternative implementations, the fabrication steps depicted in the flowchart and description may occur out of the order noted, depending upon the functionality involved.

The descriptions of the various embodiments of the present invention have been presented for purposes of illustration, but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments disclosed herein.

What is claimed is:

1. A method of fabricating a capacitor, the method comprising:
   receiving a silicon substrate with a first silicon dioxide layer over the silicon substrate;
   depositing a silicon nitride layer over the first silicon dioxide layer;
   patterning the silicon nitride layer to form a plurality of silicon nitride fins;
   growing a silicon film selectively from the silicon nitride fins; and
   depositing a dielectric layer over the silicon nitride layer.

2. The method of claim 1, further comprising forming a plurality of metal vias through the dielectric layer, wherein the metal vias are in electrical contact with the silicon film.

3. The method of claim 1, wherein the silicon nitride layer is in direct contact with the first silicon dioxide layer.

4. The method of claim 1, further comprising depositing a second silicon dioxide layer over the silicon nitride layer.

5. The method of claim 1, further comprising implanting the silicon film with a dopant species such that the silicon film is electrically conductive.

6. The method of claim 5, wherein the dopant species selected from the group consisting of phosphorus, arsenic, and boron.

7. The method of claim 1, wherein the silicon film is doped while being grown from the silicon nitride fin.

8. The method of claim 7, wherein the silicon film is doped with a dopant selected from the group consisting of phosphorus, arsenic, and boron.

9. The method of claim 1, further comprising depositing a second silicon dioxide layer over the silicon nitride layer, wherein patterning the silicon nitride layer includes patterning the second silicon dioxide layer.

10. The method of claim 1, wherein the first silicon dioxide layer is formed using thermal oxidation or chemical vapor deposition.

11. The method of claim 1, further comprising depositing a second silicon dioxide layer on the silicon nitride layer, wherein the silicon nitride layer is in physical contact with the second silicon dioxide layer.

12. The method of claim 1, further comprising polishing the silicon film.

13. The method of claim 1, wherein the dielectric layer is a flowable oxide.

14. The method of claim 1, wherein the dielectric layer is selected from the group consisting of boron silicate Glass (BSG), boron phosphorus silicate glass (BPSG), and phosphorus silicate glass (PSG).

* * * * *